United States Patent
Barbee, III et al.

(10) Patent No.: US 6,951,003 B2
(45) Date of Patent: Sep. 27, 2005

(54) PLACING CELLS OF AN IC DESIGN USING PARTITION PRECONDITIONING

(75) Inventors: Troy W. Barbee, III, Sunnyvale, CA (US); William Clark Naylor, Jr., San Jose, CA (US); Ross Alexander Donelly, Sunnyvale, CA (US)

(73) Assignee: Synopsys, Inc, Mountain View, CA (US)

( * ) Notice: Subject to any disclaimer, the term of this patent is extended or adjusted under 35 U.S.C. 154(b) by 199 days.

(21) Appl. No.: 10/436,578

(22) Filed: May 12, 2003

(65) Prior Publication Data

US 2004/0230931 A1 Nov. 18, 2004

(51) Int. Cl.[7] .............................. G06F 17/50; G06F 9/45
(52) U.S. Cl. .................................. 716/10; 716/7; 716/8; 716/9
(58) Field of Search .................................. 716/7–10, 12

(56) References Cited

U.S. PATENT DOCUMENTS

| | | | | |
|---|---|---|---|---|
| 5,493,510 A | * | 2/1996 | Shikata | 716/9 |
| 6,480,991 B1 | * | 11/2002 | Cho et al. | 716/8 |
| 6,516,313 B1 | * | 2/2003 | Perry | 707/6 |
| 6,792,585 B1 | * | 9/2004 | Ku et al. | 716/10 |

* cited by examiner

*Primary Examiner*—A. M. Thompson
*Assistant Examiner*—Magid Y. Dimyan
(74) *Attorney, Agent, or Firm*—Park, Vaughan & Fleming, LLP

(57) ABSTRACT

A method and system of placing cells of an IC design using partition preconditioning. In one embodiment, cells of an integrated circuit design are grouped to model curvature of an objective function. The grouping produce a plurality of cell clusters. The model formed may be a binary tree. The curvature of the objective function for each of the cell clusters is estimated. Interactions between said cell clusters are described as a relation. A set of preconditioning values which achieves a separation of variables of the relation is determined. The preconditioning may be applied to a conjugate gradient placement process to advantageously decrease the number of iterations required to produce an optimized placement of the cells.

21 Claims, 4 Drawing Sheets

PLACING CELLS OF AN IC DESIGN USING PARTITION PRECONDITIONING

FIELD OF THE INVENTION

Embodiments of the present invention relate to the field of electronic design automation (EDA). More particularly, embodiments of the present invention relate to computer implemented processes for cell placement and other optimizations used in the design and fabrication of integrated circuit devices.

BACKGROUND ART

The rapid growth in complexity of modem electronic circuits has forced electronic circuit designers to rely upon computer programs to assist or automate most steps of the design process. Typical circuits today contain hundreds of thousands or millions of individual pieces or "cells." Such a design is much too large for a circuit designer or even an engineering team of designers to manage effectively manually.

One of the most difficult, complex and time-consuming tasks in the design process is known as cell placement, or, more simply, "placement." The placement problem is the assignment of a collection of connected cells to positions in a 2-dimensional arena, such that objective functions such as total wire length, etc., are minimized.

Conventionally, both the X and Y coordinates of the cells are determined simultaneously. There are many well-known tools commercially available to accomplish this task, for example, the "Physical Compiler" commercially available from Synopsys of Mountain View, Calif.

Modern chip design methods often involve combining both large design elements with smaller design elements. For example, a large element may be a random access memory, or RAM, which may be designed by an automated memory compiler. Other examples of large design elements include intellectual property blocks, or "IP blocks." Such IP blocks may implement complex functions, for example a processor core or a communications design, e.g., a UART, which were designed previously and made available for integration into future designs.

The smallest design element is typically a cell, which may implement a basic logic function, for example a NAND gate. Such cells may be used to integrate existing IP designs or memory blocks together, and/or to implement new designs.

It is not unusual for a large element to be three to six orders of magnitude larger than the smallest elements. For example, it is not uncommon for a RAM (random access memory) block or cell to comprise a chip area equivalent to the area of 75,000 to 100,000 individual cells.

Modern integrated circuit designs may comprise hundreds of thousands to several million individual cells that need to be placed efficiently. Even with powerful computer systems, the time required for a placement "run" may be measured in days. A successful integrated circuit design may take several such placement runs, interleaved with other design activities, for example, wiring and post-layout simulation.

The time required for a placement process is typically not linear with respect to the number of cells to be placed. For example, a typical placement process may require on the order of $N^{1.5}$ time to process a design, where N is the number of cells. For example, a design of one million cells may take approximately 31 times as long to place as a design of one hundred thousand cells, an increase of only ten times the cell count.

Unfortunately, the processing requirements to place new chip designs are outpacing the rate of processing speed increases made available through advances in the computing arts. Consequently, improvements in integrated circuit design methods, especially for the placement problem, are highly sought after.

SUMMARY OF THE INVENTION

Embodiments of the present invention are drawn to computer controlled processes to place cells of an integrated circuit design for device fabrication and specifically precondition a placing of cells of an integrated circuit design. Further embodiments of the present invention estimate the curvature of an objective function used to optimize the placement of cells of an integrated circuit design. Still further embodiments of the present invention exploit a sequential nature of processing cells to solve a system of relations in a very efficient manner. These advantageous processes are used to more efficiently compute the X and Y locations for cells that make up the design.

A method and system of partition preconditioning are disclosed. In one embodiment, cells of an integrated circuit design are grouped to model curvature of an objective function. The grouping produces a plurality of cell clusters. In one embodiment, the model formed may be a binary tree. The curvature of the objective function for each of the cell clusters is then estimated. Interactions between said cell clusters are described as a relation. A set of preconditioning values which achieves a separation of variables of the relation is determined. The preconditioning may be applied to a conjugate gradient placement process to advantageously decrease the number of iterations required to produce an optimized placement of the cells. The cell placement obtained in this manner can be used to fabricate an integrated circuit device.

DETAILED DESCRIPTION OF THE INVENTION

Figure 1:
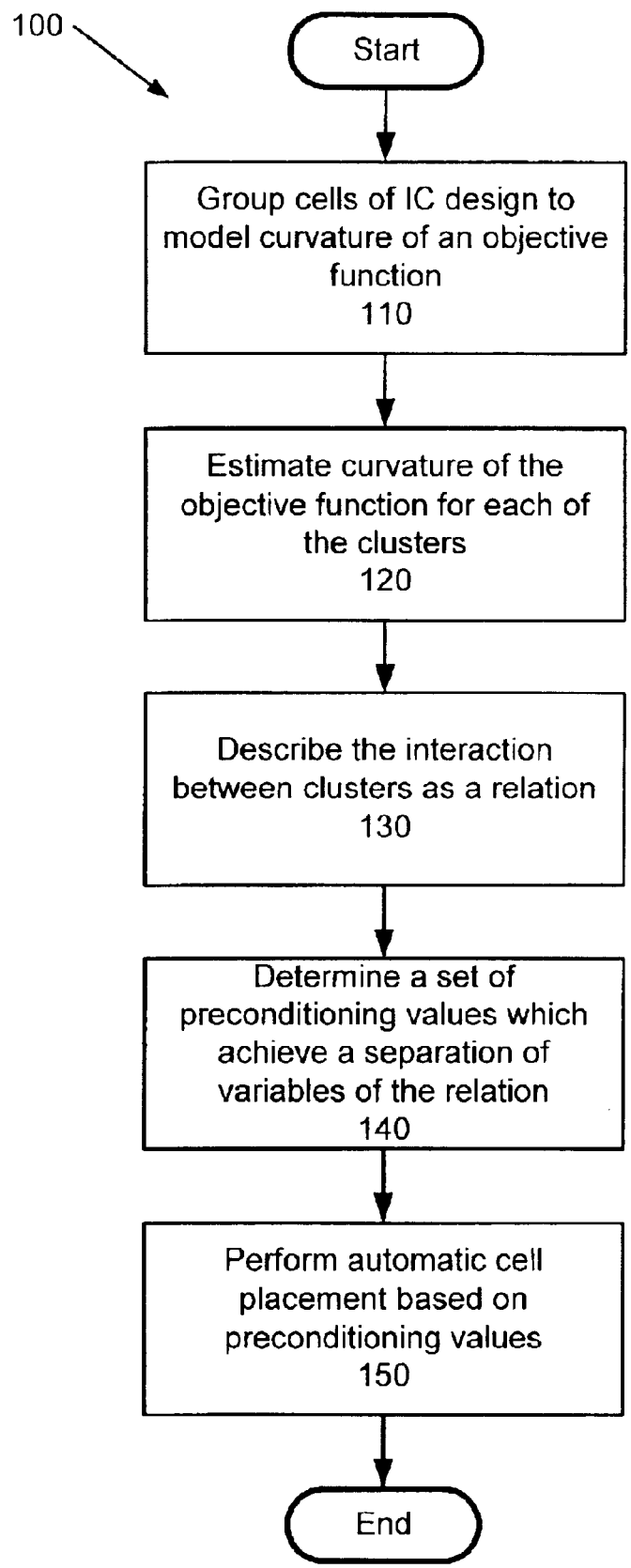
FIG. 1 illustrates a computer controlled method for determining a set of preconditioning values for use in placing cells of an integrated circuit design, according to an embodiment of the present invention.

In the following detailed description of the present invention, an automated cell placer having partition preconditioning, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail so as not to unnecessarily obscure aspects of the present invention.

Notation and Nomenclature

Some portions of the detailed descriptions which follow (e.g., process 100) are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "indexing" or "processing" or "computing" or "translating" or "calculating" or "determining" or "scrolling" or "displaying" or "recognizing" or "generating" or "selecting" or "moving" or "repeating" or "combining" or "testing" or "setting" or "increasing" or "transforming" or "determining" or "optimizing" or "synthesizing" or "grouping" or "estimating" or "describing" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Placing Cells of an IC Design Using Partition Preconditioning

Embodiments of the present invention are described in the context of the field of electronic design automation (EDA). More particularly, embodiments of the present invention relate to techniques for cell placement and other optimizations used in the design and fabrication of integrated circuit devices. It is appreciated, however, that elements of the present invention may be utilized in other areas of EDA.

The functional design of an electronic integrated circuit specifies the cells (individual functional elements) that compose the circuit and which pins of which cells are to be coupled together using wires or "nets." Typically, much or all of the design of an integrated circuit is specified in a high level language, for example "HDL." Though a process of computer implemented synthesis, or "synthesizing," high level constructs are converted into cells and nets.

"Placement" or "placing" generally refers to the important step of assigning a physical location, typically in two dimensions, in the process of physically implementing the electronic circuit, for example in an integrated circuit or on a printed wiring board. Typically, a placement process ("placer") receives as input a list of cells, or basic circuit elements, and a list of the wiring interconnections, nets, among the cells. This is commonly known as a "netlist." The placer then determines an efficient placement for these cells according to some set of criteria, e.g., wire length minimization, etc. The placer is a computer tool.

U.S. Pat. No. 6,282,693, issued Aug. 28, 2001, entitled "Non-linear Optimization System and Method for Wire Length and Density within an Automatic Electronic Circuit Placer," to Naylor, et al., and assigned to the assignee of the present invention, is hereby incorporated herein by reference in its entirety.

U.S. Pat. No. 6,301,693, issued Oct. 9, 2001, entitled "Non-linear Optimization System and Method for Wire Length and Delay Optimization for an Automatic Electronic Circuit Placer," to Naylor et al., and assigned to the assignee of the present invention, is hereby incorporated herein by reference in its entirety.

"Preconditioning" is generally understood to refer to the act of scaling, or a scaling of, variables that appear in a problem in order to make an optimization process converge faster. For example, while trying to optimize a multi-variable objective function, a given quantity change in a first variable may have much more effect on the objective function than the same change in another variable. The process of optimizing the objective function will tend to favor changes in the first variable.

This may lead to extremely slow convergence of the optimization process. Preconditioning serves to scale the variables, or "level the playing field," such that changing each variable affects the objectives functions by a comparable amount, resulting in quicker convergence to the global minimum.

For example, the gradient of $F(x,y)=x^2+3y^2$ does not point directly to the minimum of the function. However, by scaling the function $F(x',y')=x'^2+y'^2$, the negative of the gradient points directly at the minimum. Preconditioning may be thought of as a process of transforming variables of a function such that the (negative of the) gradient of the function points directly at the optimum set of values to minimize the function.

A master objective function (MOF) may be defined which evaluates the quality of a particular cell placement. In effect, the MOF measures the "goodness" of the particular cell placement. The MOF is chosen so that values of variables which minimize the MOF correspond to a good coarse placement.

In particular, the MOF is a weighted sum of functions which evaluate various metrics of an integrated circuit placement. An important metric taken into consideration within the MOF is the density function which measures how well spread out the cells are in the placement. Other component functions of the MOF may be a wire-length function which measures total linear wire-length, a delay function which measures circuit timing, and a power function which measures circuit power consumption. The barrier metric or "boundary function" penalizes placements with cells outside the allowed placement region. An MOF is shown below as Relation 1, where the notation "*vars" denotes vector variables:

$$MOF(*vars)=wb*\text{barrier}(*vars)+wd*\text{density}(*vars)+wL*\text{wire length}(*vars)+wT*\text{delay}(*vars)+wp*\text{power}(*vars) \quad (1)$$

where the w terms are constants and *vars include:

(x, y) coordinates of cells, pins for cell placement, size of cells and buffers for sizing, buffer area of wire for buffer insertion, buffer tree depth on wire branch for buffer tree balancing, and logic tree depth on logic tree input for timing driven structuring.

It is to be appreciated that a modern semiconductor based integrated circuit design may have several million cells. As described above, a master objective function for such a design may have tens of variable terms per cell. Consequently, a master objective function may comprise, for example, tens to hundreds of millions of terms.

Based upon an assumption that the preferred master objective function is a quadratic expression, an ideal preconditioning to minimize a master objective function could be constructed by computing the first and second derivatives of each variable with respect to all of the other variables of the master objective function. The optimum direction of movement to minimize the MOF could then be determined at any given cell by dividing the gradient of the MOF for the cell by a matrix comprised of the second derivatives of the MOF.

Unfortunately, a realistic MOF may not be quadratic, and may be approximated as a quadratic expression only near the minimum. In addition, it may be commercially infeasible to invert a matrix that comprises millions of terms on a side. Further, conventional approaches to preconditioning, for example in a variety of physics problems, depend upon highly accurate curvature models. However, in contrast to conventional experience, the problem of placing cells in an integrated circuit benefits from more generalized, more global curvature models. This may be due, in part, to the complexity of the MOF. For example, there are many interactions between terms of the MOF, and the MOF is highly non-linear. Consequently, efforts to create a partition preconditioning for placement of cells within an integrated circuit have been poorly served by conventional approaches to precondition a problem, and a novel approach is required.

A usable preconditioning may be determined by estimating the second derivative of the master objective function. Relation 2 below represents the second derivative with respect to x of the master objective function as the sum of the second derivatives of the components of the master objective function.

$$\frac{\partial^2 MOF}{\partial x_i^2} = \frac{\partial^2 wd * \text{density}(*\text{vars})}{\partial x_i^2} + \frac{\partial^2 wL * \text{wire\_length}(*\text{vars})}{\partial x_i^2} \ldots \quad (2)$$

So as not to obscure elements of the present invention, only two terms of the MOF (Relation 1) are shown in Relation 2. It is appreciated that other terms of a MOF may be similarly differentiated and included.

FIG. 1 illustrates a computer controlled method 100 for determining a set of preconditioning values for use in placing cells of an integrated circuit design, according to an embodiment of the present invention. The entire method 100 will be summarized immediately below, and each step will subsequently be discussed in greater detail in the following pages.

In step 110, cells of an integrated circuit design are grouped to model curvature of an objective function, for example the MOF given in Relation 2. In step 120, curvature of the objective function is estimated for each of the clusters. In step 130, the interaction between clusters is described as a relation. In step 140, a set of preconditioning values which achieves a separation of variables of the relation is determined.

In optional step 150, the preconditioning values determined in step 140 are used to perform an automatic cell placement. It is to be appreciated that embodiments of the present invention are well suited to performing either an intermediate placement or a final placement of the cells of an integrated circuit design using the preconditioning values.

Expanding upon step 110, in one embodiment, curvature of an objective function is modeled using a hierarchical binary tree. The leaves of the tree are single cells of the integrated circuit design and each node in the tree represents a cluster or group of cells. The root represents all cells. Nodes may comprise multiple clusters. A tree structure facilitates placement optimization by allowing entire clusters to move by changing a single variable, e.g., the variable associated with the cluster's node in the tree. Tree-based clustering speeds convergence by decreasing the time for one cell's movement to affect all other cells from on the order of $N^{0.5}$ to the order of log(N), For large N, this yields substantial improvements in runtime.

It is desirable for the tree's clustering (grouping) to match the structure of the integrated circuit design so that the cells in a cluster start together and stay together during placement. An example is a large integrated circuit design with a multiplier module inside it. The multiplier module is highly connected initially, and typically should stay that way throughout the placement. Consequently, a "good" grouping would make the exemplary multiplier one of the clusters in the tree. However, the preconditioning process does not know that this portion of the design is a multiplier. A preconditioning process has no knowledge of the user hierarchy or the high level design language typically used to generate an integrated circuit design. To a preconditioning process, the design is represented by a collection of leaf-level cells connected by wires. Consequently, a preconditioning process should determine cluster groups primarily by their connectivity and current position.

The tree should be built from the leaves up. Initially, the tree is empty and all cells are ungrouped. Cells are optimally placed together to determine the next levels of hierarchy based upon a measure of how related they are.

Small link structures called "springs" are created between pairs of cells. The springs are used to model the attraction (or spring "force") between cells and/or groups of cells represented by tree nodes. It is to be appreciated that such springs do not physically exist. Rather they may be thought of as a prediction of relationships among cells and clusters of cell in a final, optimized placement of those cells.

A spring is created between two cells if and only if they are connected by a net with no more than T pins (interconnects). T is a fixed threshold, for example, five. A threshold is needed because a net will require on the order of $N^2$ springs, where N is the number of pins on the net. The exclusion of the larger nets is generally not detrimental because large nets are less significant when measuring the relatedness of two cells.

Each spring is assigned a score, or "spring force." The score is a measure of how related the two cells are. The preconditioning process has information on where all cells are currently placed, for example the cell's X,Y coordinates. It also knows which net(s) connect the two cells and how many pins there are on each net.

Longer nets should receive a lower score, on the basis that if the cells are not held closely together in the present position, there is probably no need to hold them closely together and hence these cells are not highly related. Nets with more pins should also receive a lower score, on the basis that there is no immediate grouping implied by these nets. Any grouping implied will take place on a larger scale (e.g., for a clock net) and can be left until later in the process when the higher levels of the tree are being grouped.

Consequently, an exemplary relation for determining a relatedness score is presented as Relation 3, below:

$$\text{score}(C1, C2) = \text{sum over nets } i \text{ connecting } C1 \text{ and } C2(Wi) \quad (3)$$

where C1 and C2 are leaf-level cells, $$Wi = 2/(Ni*(Ni-1)*Li^2),$$

Ni is the number of pins on net i, and Li is the length of net i, which is measured as half the length of the perimeter of the bounding box of all pins on the net.

It is appreciated that embodiments of the present invention are well suited to a wide variety of systems for scoring the relatedness of cells. For example, a score could be based on distance between the two cells instead of the length of the nets joining them.

The 2/N(N−1) formula implies that the sum of contributions of any net will be independent of the number of pins on the net (because the number of attracts will be 0.5N(N−1)), although this condition is not necessary for embodiments of the present invention.

Relation 3 above gives a score or "strength" for each spring. The springs will subsequently be merged by inserting them all into a priority queue and merging the best ones first. However, if the score of Relation 3 above was further used to determine merging, the subsequent merging is generally unstable and tends to create very unbalanced trees. A more desirable merging metric would favor merging small cells (or clusters) earlier so that such small cells (or clusters) are not left until later mergers with the consequence that the tree becomes unbalanced.

A new metric for merging the priority queue is given by Relation 4, below:

$$\text{metric}(C1, C2) = \frac{\text{score}(C1, C2)}{\min(\text{Area}(C1), \text{Area}(C2))^2} \quad (4)$$

where Area(X) is the area of object X (the actual physical area of the cell(s) in the cluster), and "min" is a function which chooses the minimum value from an argument list.

Embodiments of the present invention are well suited to a variety of metrics to determine merging sequence. Examples investigated but found less desirable than Relation 4 include: $(\text{Area}(C1)+\text{Area}(C2))^2$; $(\text{Area}(C1)*\text{Area}(C2))^2$; and $\log(\text{Area}(C1))+\log(\text{Area}(C2))-\log(\text{Area}(C1)+\text{Area}(C2))$.

According to the process, once the priority queue is set up, the best or "strongest" spring is identified and "collapsed." That is, a new node is created in the tree that is the parent of the leaf-cell nodes for C1 and C2. The new node represents the grouping of C1 and C2. The old spring between C1 and C2 is destroyed. Some of the springs connecting C1 and C2 to other nodes may need to be merged. For example, C1 and C2 may both have an attraction (spring) to C3. These two springs will be merged into a single new spring between the new parent node and C3. When two springs are merged, their scores (not their metrics) are summed. The old springs are deleted from the priority queue and the new spring, with its consequent new metric, is inserted. Advantageously, executing and merging may be performed in order (log N) time per attraction link, or spring.

The merging process, using the formula above, is repeated. However instead of C1 and C2 always being leaf cells, they may be groups or clusters of cells represented by nodes in the tree. It is appreciated that the Relation 3 need not be invoked again. Scores are summed when attracts are merged.

After repeated iterations of the merging process, there will be no springs left to merge. At this point, the disjoint netlists resulting from pruning out all of the nets with more than T pins from the design will remain unmerged. Many of the disjoint netlists are single cells that were attached only to nets with T pins or more. A binary tree is created for each disjoint netlist. All of the disjoint trees are merged into (i.e. made children of) a single node, the root node. The root node is special in that it represents the entire design. Consequently, the root node has no placement information for cells, or clusters of cells, associated with it.

A bottom-up tree-building method is preferred because it is fast and not overly complex to implement. Embodiments of the present invention are also well suited to a top-down tree-building approach. However such a top-down tree-building method is likely to introduce at least another factor of log N into the runtime, since all cells typically need to be traversed at each level of the tree. Many conventional placement processes employ top-down partitioning. Such a top-down partitioning has a typical runtime on the order of $N^{1.5}$, which is much slower than embodiments of the present invention. Although a top-down partitioning may result in a more balanced tree, the bottom-up partitioning herein described is advantageously much faster, and sufficient for preconditioning.

A tree-of-springs model has as its leaf nodes actual cells of the integrated circuit design. It is appreciated that a single "cell" may be relatively simple, e.g., a NAND gate, or very complex, e.g., a "hard macro." Each cell is further modeled as having an attraction to an "attraction point." A cell's attraction point is a point on the chip towards which the cell is "attracted." The attraction point is an artificial construct used to balance other "forces" (attractive tendencies) which influence the placement of a cell.

Figure 2:
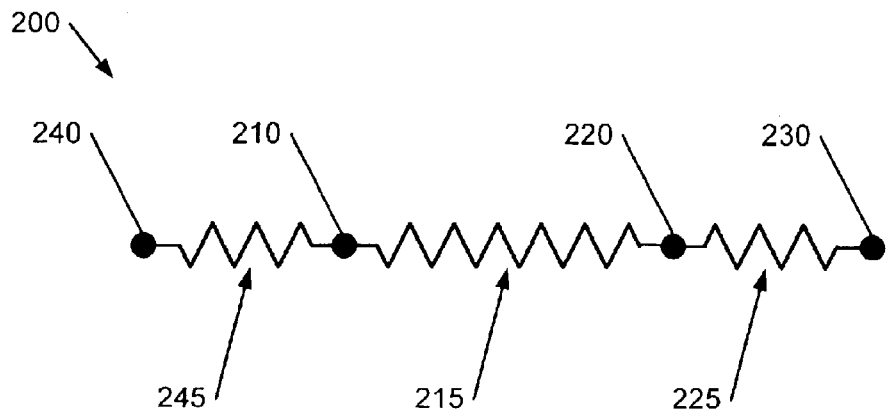
FIG. 2 illustrates a simplified tree-of-springs model, according to an embodiment of the present invention.

FIG. 2 illustrates a simplified tree-of-springs model, according to an embodiment of the present invention. Cell 210 and cell 220 are cells of an integrated circuit design. Spring 215 models the attraction force between cells 210 and 220. It is to be appreciated that in a more complex model, spring 215 may actually be exerting a repulsive force. Spring 225 models the attraction for cell 220 to its attraction point 230. Spring 245 models the attractive force of cell 210 to its attraction point 240. The use of attraction points serves to keep the model in balance. Without attraction points 230, 240 and springs 225, 245, cells 210 and 220 would be pulled as close as possible together.

According to an embodiment of the present invention, the actual location of attraction points need not be determined. Given that the energy in a spring is proportional to the square of its displacement, a tree-of-springs objective function may be expressed as shown below in Relation 5.

$$F_{springs} = \frac{1}{2}\sum_{\langle i,j \rangle} C_{ij}(x_i - x_j)^2 + \frac{1}{2}\sum_{i} C_{i0}(x_i - x_{i0})^2 \quad (5)$$

where $x_i$, and $x_j$ are different cells, and $x_{i0}$ is the attraction point. It is to be appreciated that since the second derivative of Relation 5 is a constant, the actual value of $x_{i0}$, the location of the attraction point, does not contribute to the curvature.

Figure 3:
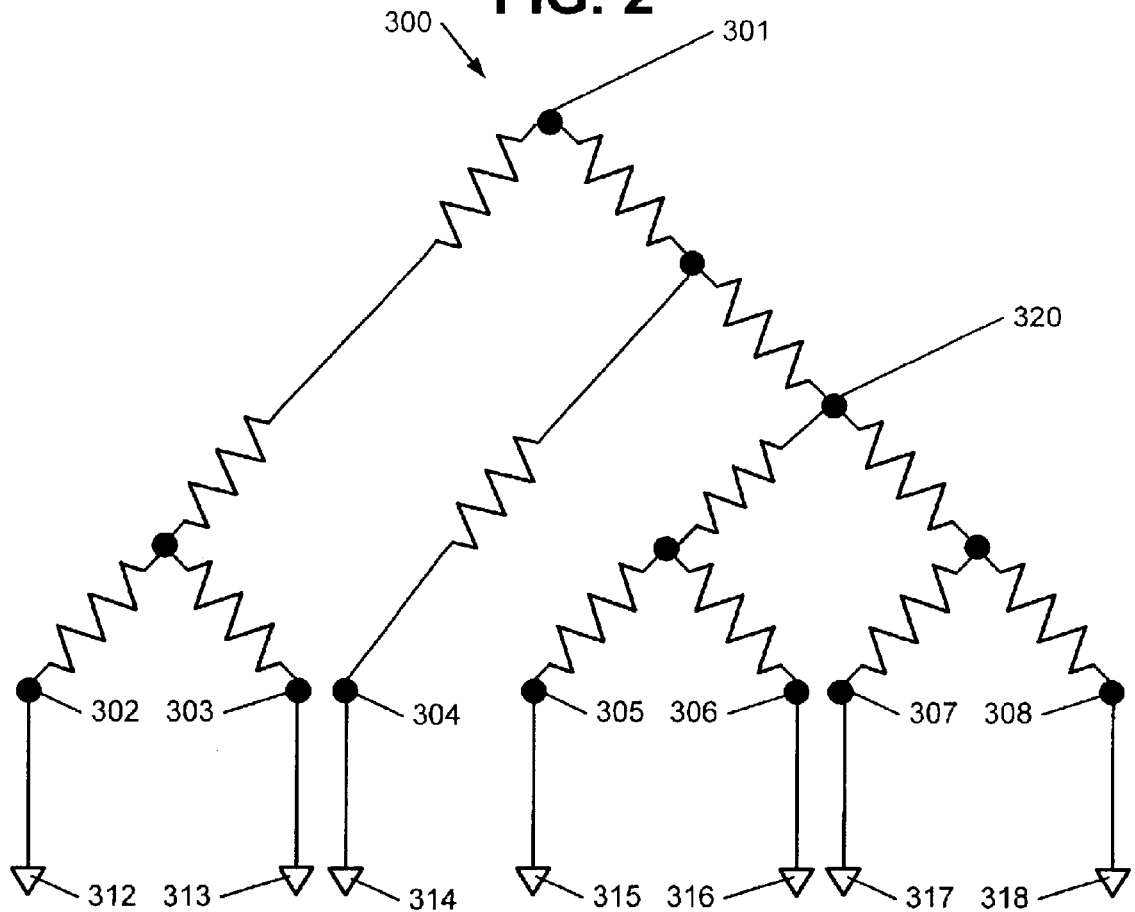
FIG. 3 illustrates a general tree of springs model, according to an embodiment of the present invention.

FIG. 3 illustrates a general tree of springs 300, according to an embodiment of the present invention. Root node 301 represents the entire design. Leaf nodes 302–308 represent individual cells of the design. Node 320 is a cluster node representing leaf nodes (cells) 305–308, the groupings of those cells and the attraction "forces" of the cluster. For example, cell 307 is more strongly attracted to cell 308 than to cell 306. However, cell 307 has a stronger attraction to cell 306 than to cell 302.

Given a master objective function of n variables, F, to be optimized, the second derivative is known as the Hessian, H. H is an n×n matrix of second derivatives with respect to each variable of the function. A desirable preconditioning is related to the inverse of H, denoted $H^{-1}$. Inverting a matrix is normally an $N^3$ process. That is, time to invert the matrix is proportional to the cube of the size of the matrix. However, as will be discussed in greater detail below, this particular H matrix is extremely sparse and may be inverted in linear time. The inverse Hessian may be determined by traversing the tree-of-springs model from child node to parent, inverting at each node. Applying $H^{-1}$ to a vector may also be performed in linear time. As a beneficial result of the tree-of-springs model, all operations of determining a preconditioning and applying the preconditioning may be performed in linear time.

Preconditioning may be viewed as a domain transfer between a "real" or "chip" space, e.g., a master objective function in terms of the X, Y coordinates of cell positions, and a "preconditioned" space wherein an objective function is more easily optimized. A function A transforms a vector X in chip space to a vector Y in preconditioning space. A-inverse ($A^{-1}$) similarly transforms Y' from preconditioning space into X' in chip space. A function $A_G$ transforms a gradient vector $g_x$ from chip space to $g_y$ in preconditioning space.

According to an embodiment of the present invention, step 150 may be implemented as described below. Given a cell location in a placement X, via the use of the transforms A and $A_G$, this location and its gradient $g_x$, may be transformed into the preconditioning domain, producing Y and $g_y$. An optimizing process, for example the conjugate gradient optimization method described in U.S. Pat. No. 6,282,693, may then produce a new placement Y'. New placement Y' may then be transformed into chip space via $A^{-1}$, producing X'. The gradient of X' is determined in chip space, transformed into preconditioning space, and yet another new placement is determined. This process is repeated until no further improvement in the master objective function is possible, or another termination criteria is met, for example a maximum run time has elapsed.

A smoothing variable, alpha, is used to alter the MOF through multiple passes of a conjugate-gradient placement process. To estimate curvature of the MOF at a particular cell placement, the smooth length, alpha, is assumed to be much larger than the size of the bounding box. For example, all of the cells of a cluster are assumed to be in one place. Based upon this assumption, the actual location of a particular cell within a net does not matter (for the purposes of estimating curvature).

The wire length is given by Relation 6 below:

$$wirelength = \alpha \log\left(\sum e^{\frac{x_i}{\alpha}}\right) - \alpha \log\left(\sum e^{-\frac{x_i}{\alpha}}\right) \quad (6)$$

Where $\alpha$ is the smooth length and $x_i$ is cell location.

The derivative of Relation 6 takes the form shown below in Relation 7:

$$wirelength' = \frac{e^{\frac{x_i}{\alpha}}}{\sum e^{\frac{x_i}{\alpha}}} + \frac{e^{-\frac{x_i}{\alpha}}}{\sum e^{-\frac{x_i}{\alpha}}} \quad (7)$$

Substituting $x_i=0$ based on the previous assumption that alpha is much larger than the net length, the derivative takes the form of 2/N, where N is the number of pins on the net. The second derivative of Relation 6 is approximately $2/\alpha N^2$, which is an estimate of curvature. Consequently the estimated curvature depends only on the number of pins in the net and size of the smooth length. Thus, the curvature of the MOF at a cell due to a single pin may be computed as a constant, C. The total curvature at the cell, due to wire length is then approximately equal to the sum of the curvatures for each net coupled to the cell.

According to an alternative embodiment of the present invention, a weighting factor may be combined with wire length. For example, a predetermined net, e.g., a clock net, may be given a greater weighting factor in order that the optimization process favors making the clock net shorter.

Another component of the master objective function may be a density term. In general terms, a density function works to move cells apart, for example, so that they do not overlap. It is appreciated that a density function typically does not ensure that cell placements meet all requirements for production, e.g., that the placements are "legal."

There are two principal stages to estimate the curvature of the MOF. First, the spatial curvature of the field density grid is estimated. Second, the curvature (i.e. 2nd derivative) of the field objective function with respect to the coordinate of a single cell C is estimated. This is done for each cell.

The field grid is a 2-dimensional array of numbers. It is a density map of cells over the placement area. The field grid is described in greater detail in U.S. Pat. No. 6,282,693. Expressed as a function F(x,y) where x and y are the integer indices in the array, then each region in the function will have a different curvature. The curvatures are then $\partial^2 F/\partial x^2$, the self-curvature in x, and $\partial^2 F/\partial y^2$, the self-curvature in y. (The cross curvature is not used.) The average of the two curvatures over the entire grid is then measured.

To measure the x curvature, the field grid is convolved with a small curvature-measuring template function. This gives a 2-dimensional map of x curvature over the chip. Then the map is averaged to get the curvature.

A template function T(x,y) is designed to match the shape of the field contribution function C(x,y) for a typical cell. T is equal to $\partial^2 C/\partial x^2$, the second derivative in x of C(x,y).

A field contribution function C(x,y) is described in U.S. Pat. No. 6,282,693 as the product of two piecewise quadratic functions, one in x and one in y. Each looks like a hill made out of four quadratic sections. The dimensions of the hill depend on the radius R, unless the cell is large. A typical cell is assumed to be small.

If the radius, R, equals 2, then T(x,y) is given by Table 1, below:

TABLE 1

| | | | |
|---|---|---|---|
| 0.5 | −0.5 | −0.5 | 0.5 |
| 1 | −1 | −1 | 1 |
| 0.5 | −0.5 | −0.5 | 0.5 |

If R equals 4, T(x,y) is given by Table 2, below:

TABLE 2

| 0.125 | 0.125 | −0.125 | −0.125 | −0.125 | −0.125 | 0.125 | 0.125 |
|---|---|---|---|---|---|---|---|
| 0.5 | 0.5 | −0.5 | −0.5 | −0.5 | −0.5 | 0.5 | 0.5 |
| 0.875 | 0.875 | −0.875 | −0.875 | −0.875 | −0.875 | 0.875 | 0.875 |
| 1 | 1 | −1 | −1 | −1 | −1 | 1 | 1 |
| 0.875 | 0.875 | −0.875 | −0.875 | −0.875 | −0.875 | 0.875 | 0.875 |
| 0.5 | 0.5 | −0.5 | −0.5 | −0.5 | −0.5 | 0.5 | 0.5 |
| 0.125 | 0.125 | −0.125 | −0.125 | −0.125 | −0.125 | 0.125 | 0.125 |

It is appreciated that these templates would be different for a different contribution function.

The y curvature computation is similar to the x computation, except that the grid is mirrored about the line x=y (i.e. interchange x and y) before the computation.

Consider a cell C at coordinate (x, y). As x is varied, the field density grid will change and hence the field objective, ob, will change. The process estimates the curvature of that change without actually moving the cell in order to measure it. The quantities being estimating are the self-curvature of the field objective in x, $\partial^2 ob/\partial x^2$, and the self-curvature of the field objective in y, $\partial^2 ob/\partial y^2$.

According to an embodiment of the present invention, step 130 will now be discussed in greater detail. In order to determine a relation for the curvature of a field objective function as the position of any cell C varies, some assumptions about the field density grid may be made. For example, assume that the grid is continuous (infinitely fine) and that it is locally quadratic. Complex, but well known mathematics (e.g., a conventional symbolic calculus software package) may then be used to compute the effect of moving an existing cell by an amount dx. It is appreciated that similar assumptions for a different field contribution function are well suited to embodiments of the present invention.

Relation 8, below, gives the curvature of a field objective function as the position of any cell C varies. It is appreciated that Relation 8 corresponds to a specific field contribution function.

$$\frac{\partial^2 ob}{\partial x^2} = h^2\left(\frac{184}{45} + \frac{16w}{3R}\right) + h\frac{\partial^2 F}{\partial x^2}R\left(\frac{184}{45}R + 16(Rw)^{1/2}\right) \quad (8)$$

where h is the magnitude of contribution of C, which is proportional to Area(C) if C is small and is fixed if C is large, and w is y_dim−R/2, where y_dim is the y-size of the contribution of C. If C is small, y_dim=R/2 and hence w=0. Large cells have nonzero values of w, which depend on the y-size of the cell. The calculation of $\partial^2 ob/\partial y^2$ is similar.

As a result of computing the estimated curvatures for wire length and density, each cell (leaf node of the binary tree) may be assigned a number. That cell value is an estimate of the curvature for moving the cell. In other words, the cell value is an estimate of the rate of change of the derivative of the master objective function. Using numeric analysis terminology, these values estimate the diagonal element of the Hessian.

Advantageously, calculating the self second derivatives as described above is of order N, whereas there are $N^2$ total second derivatives. Consequently, this technique is orders of magnitude faster than conventional numeric analysis which requires inverting the Hessian matrix.

Curvature estimates for parent nodes (clusters of cells, or clusters of clusters) may be determined from the curvature estimates for each leaf node (which represents an individual cell).

Figure 4:
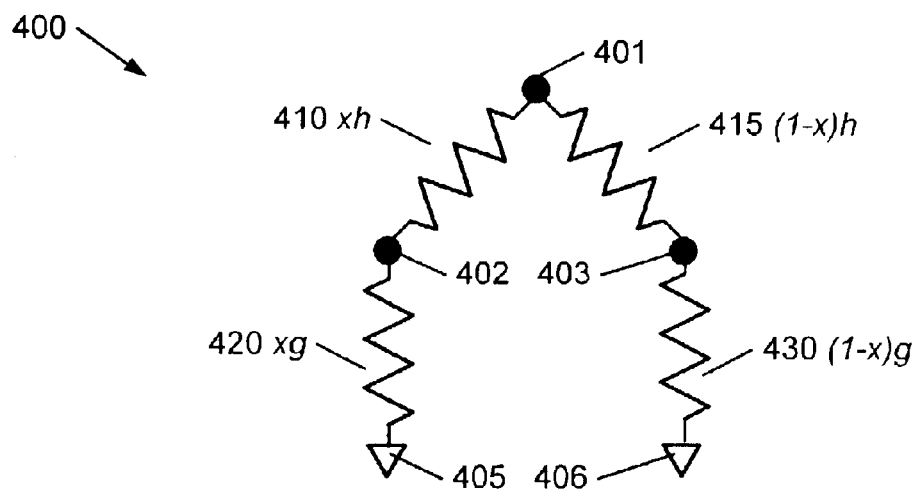
FIG. 4 illustrates a portion of a hierarchical binary tree model, according to an embodiment of the present invention.

FIG. 4 illustrates a portion 400 of a hierarchical binary tree, according to an embodiment of the present invention.

Node 401 is a parent node, and represents a cluster of cells or a cluster of clusters of cells. Nodes 402 and 403 are child nodes, and in general may also be a parent node to other child nodes (not shown). Nodes 401, 402 and 403 may represent a branch at any level of the tree. If nodes 402 and 403 are leaf nodes, attraction points 405 and 406 are added to "anchor" the leaves.

Spring 410 models the attraction, or force between the cells or clusters represented by nodes 401 and 402. Similarly, spring 415 models the attraction, or force between the cells or clusters represented by nodes 401 and 403. If nodes 402 and 403 are leaf nodes, spring 420 models the attraction between node 402 and anchor point 405, and spring 430 models the attraction between node 403 and anchor point 406.

As described previously, an estimated curvature has been determined for all nodes. Given the structure of tree 400, there are four unknowns (spring forces) and three pieces of information (the curvature estimates for nodes 401, 402 and 403). As a result, the problem is under determined. Consequently, an assumption should be made. The preferred assumption is that the spring tree is in equilibrium and that the parent-child and child-attraction point spring strengths are divided proportionally as described below. Assign the strength of spring 420 to be x times some constant g, xg. Spring strength 430 may then be assigned (1−x)g. Similarly, spring strength 410 may be assigned xh and spring strength 415 correspondingly is assigned (1−x)h.

Expressing an objective function as a spring strength, MOF=a(x−$x_0$)$^2$, the second derivative is given as MOF"=2a. Consequently, because the tree segment is in balance, the curvature of the parent cluster, Cp is 2g, or g=Cp/2. With a known value for g, x and h may be determined by well known means.

Figure 5:
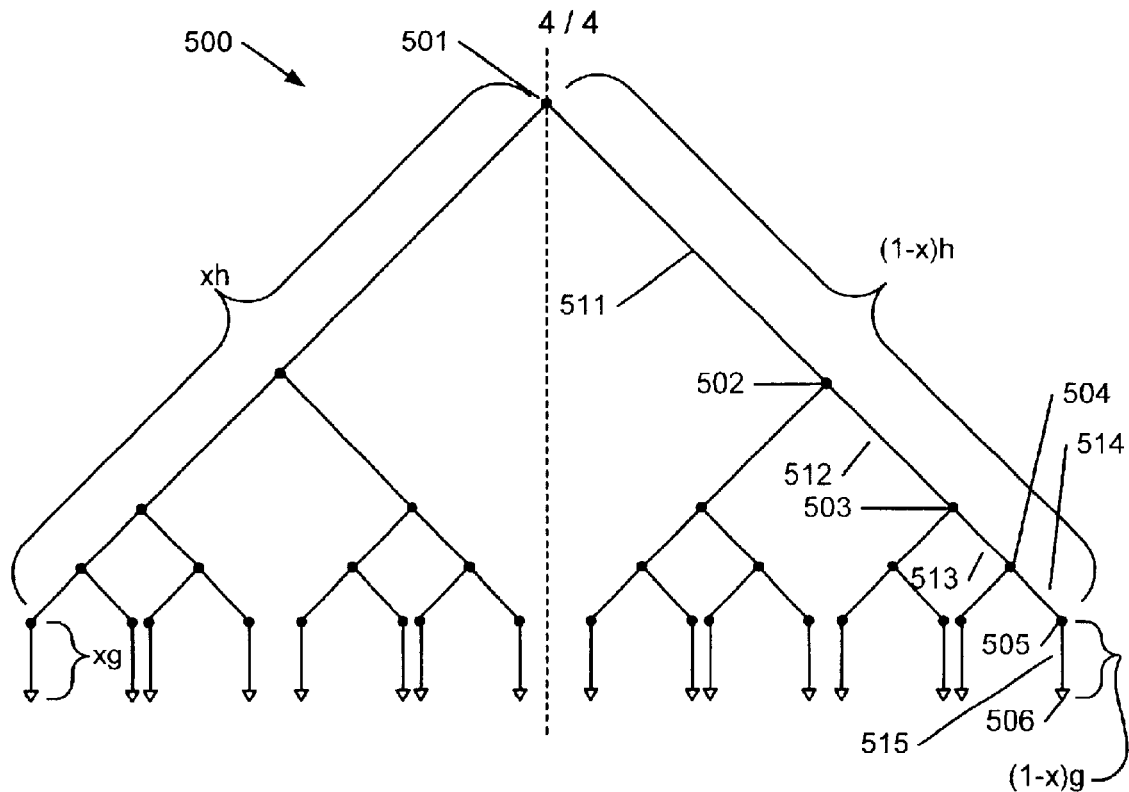
FIG. 5 illustrates a five-level tree binary tree model, according to an embodiment of the present invention.

According to an embodiment of the present invention, step 140 is discussed in greater detail below. To determine spring strengths in a more generalized tree, the tree is traversed from the top of tree, the root node, once (estimated) curvatures have been determined. FIG. 5 illustrates a five-level tree binary tree 500, according to an embodiment of the present invention. It is to be appreciated that the tree does not need to be perfectly balanced. For clarity, the spring symbols between nodes are not depicted. Node 501 is the root node of tree 500. Node 505 is a leaf node, representing a single cell of an integrated circuit design. Nodes 502, 504 and 504 are both parent nodes, representing clusters, to the nodes below them, and child nodes to the nodes above them. Springs 511–514 represent the attractive forces between the respective cells and clusters of cells. Spring 515 represents the attraction of node 505 to its attraction point 506.

As described previously, the spring strengths may be determined based upon an assumption of equilibrium. The value xh is assigned to the combination spring from the root down the left side of the tree to the level of the leaves. The value xg is assigned to the sum of the spring attractions to the left-half leaves' respective attraction points. Likewise, (1−x)h is assigned to the combination spring from the root down the right side of the tree to the level of the leaves, and (1−x)g is assigned to the sum of the spring attractions to the right-half leaves' respective attraction points.

Figure 6:
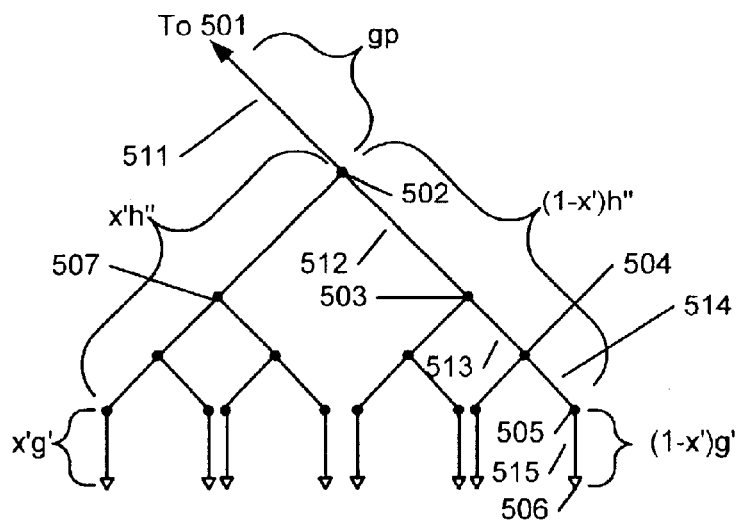
FIG. 6 illustrates the right half of a tree, according to an embodiment of the present invention.

FIG. 6 illustrates the right half of tree 500, according to an embodiment of the present invention. The value e=xh represents the strength of the combination spring of the other half of the tree, based upon the equilibrium assumption. The value h'=(1−x)h represents the strength of the combination spring of the right half of the tree, also based upon the equilibrium assumption. The value g'=(1−x)g represents the sum of the spring attractions to the right-half leaves' respective attraction points. Unlike the simpler case described in FIG. 4, the curvature of the parent node, e.g., node 502, is not just a function of the (combined) g' spring. Rather, the e spring now acts upon a non-root parent node. Thus, Relation 9 below describes the interaction between the new subset of springs and combinations.

$$\frac{Cp}{2} = g' + \frac{eh'}{e+h'} \quad (9)$$

Where Cp is the curvature of the parent node, e.g., node 502. Further, $$\frac{1}{2}(C_{c1} + C_{c2}) = \frac{1}{2}Cp + 2x'(1-x')\left(h'' - \frac{eh'}{e+h'}\right) \quad (10)$$

$$gp = \frac{h'h''}{h''-h'}$$

where $C_{c1}$ and $C_{c2}$ are the curvatures of the child nodes, e.g., node 503 and its sibling 507, and gp is the strength of spring 511.

By the use of Relations 9 and 10, a general binary tree of springs may be recursively traversed to determine all of the spring forces. Occasionally, a spring force may appear to be negative. For example, a negative spring force appears to be pushing adjacent nodes apart. Under such circumstances, processing of the tree may not converge. According to an embodiment of the present invention, a negative spring force may be replaced with a positive approximated spring force.

The curvature of the objective function of the placer (the MOF) is modeled by the curvature of the objective function of the system of springs. The objective function of the system of springs is the energy stored in the system of springs. Relation 11 below illustrates the energy of the system of springs. The energy of a system of springs is the sum of the energy in each spring, given by a spring constant, k, times the square of the spring's displacement.

$$F(ob,\ spring) = \frac{1}{2} \sum_{\substack{springs \\ (i,j)}} k_{ij}(x_i - x_j)^2 \quad (11)$$

The curvature of the spring objective function (Relation 11) is similar to the curvature of the master objective function for placement (Relation 1). Consequently, a preconditioning for the spring objective function may be used to precondition the master objective function.

The second derivative of the spring objective function with respect to its coordinates is constructed, which results in a Hessian matrix. It is to be appreciated that the Hessian corresponding to a tree of springs model is extremely sparse since each node is coupled to at most three other nodes. In matrix notation, $$F(ob,\ spring) = \frac{1}{2}(x(*vars) - x_0(*vars))^T \cdot H \cdot (x(*vars) - x_0(*vars)) \quad (12)$$

where the notation *vars indicates a vector quantity.

Previously, transform A was defined such that x(*vars)= Ay(*vars) and y(*vars)=A$^{-1}$x(*vars). Relation 12 may be rewritten as Relation 13, below:

$$F(ob,\ spring) = \frac{1}{2}(Ay(*vars) - Ay_0(*vars))^T \cdot H \cdot (Ay(*vars) - Ay_0(*vars)) \quad (13)$$

$$\frac{1}{2}(y(*vars) - y_0(*vars))^T \cdot A^T HA \cdot (y(*vars) - y_0(*vars))$$

If A=H$^{-1/2}$, the square root of the inverse Hessian, then (A$^T$HA) is the identity matrix. Thus, the spring objective function is ½ times a constant times the y displacement squared, $$\frac{1}{2}c(y(*vars) - y_0(*vars))^2.$$

A relation of this form is well understood. For example, the derivative is c(y−y$_o$) which points perfectly at the minimum regardless of how many dimensions are present.

Previously, a gradient transform A$_G$ was defined, such that g$_y$(*vars)=A$_G$g$_x$(*vars).

The Hessian has a tree structure reflective of the tree of springs model. By a method of Gaussian elimination starting at the leaves, walking to the top of the tree, in effect each child node only interacts with its parent node. The parent-child off-diagonal entry may be eliminated. Advantageously, this elimination may be performed without fill in and in a single step per node. As a beneficial result, the elimination process proceeds in highly desirable linear time with respect to N.

To construct the A transformation matrix such that A$^T$HA is the identity matrix, A is defined according to Relation 14 below:

$$A = \prod_{i=1}^{N}(F_i D_i) \quad (14)$$

where $F_i$ is a matrix for performing Gaussian elimination, with ones on the diagonal, zeros elsewhere except for a term in the i-j location, $f_i$ to eliminate an off-diagonal element. $D_i$ is a scaling matrix, with ones on the diagonal, except for one entry that scales the $i^{th}$ diagonal element of H to be one.

The transforms x(*vars)=Ay(*vars) and y(*vars)=A$^{-1}$x (*vars) may be restated in a form similar to Relation 13 by use of the expansion of A:

$$x(*vars) = ((F_1 D_1)(F_2 D_2) \ldots (F_N D_N))y(*vars) \quad (15)$$

$$y(*vars) = ((D_N^{-1} F_N^{-1})(D_{N-1}^{-1} F_{N-1}^{-1}) \ldots (D_1^{-1} F_1^{-1}))x(*vars) \quad (16)$$

Similarly, $$g_y(*vars) = A^T HA(y(*vars) - y_0(*vars))$$

$$= A^T H(x(*vars) - x_0(*vars))$$

$$= A^T g_x(*vars)$$

because A(y(*vars)−y$_0$(*vars))=x(*vars)−x$_0$(*vars).

Advantageously, according to an embodiment of the present invention, it is not necessary to construct or store the F and D matrices. Nor is it required to actually perform the matrix multiplication operations. Rather the simple scaling and elimination of the very sparse matrix operations may be performed as scalar operations.

According to an embodiment of the present invention, a preconditioning (set of preconditioning values) may be determined and applied at multiple points in a placement process. Advantageously, the entire process for building the tree takes on the order of N log N time and on the order of N memory. As such, it can be done many times during a placement without a deleterious increase in total run time. Multiple terms of a master objective function, for example wire length and density, vary according to the actual placement of cells. A smoothing variable, alpha, is used to alter the MOF through multiple passes of a conjugate-gradient placement process. Alpha may generally be altered on each pass until the process terminates or convergence is reached. A new preconditioning should be determined each time alpha is changed.

In this novel manner, one or more preconditionings of an integrated circuit cell placement problem may be generated in linear time. Each preconditioning enables a placement process to converge far more quickly than is typically otherwise possible. As a beneficial consequence, a placement employing embodiments of the present invention may complete a placement process far more rapidly and with higher quality results than the conventional art.

Figure 7:
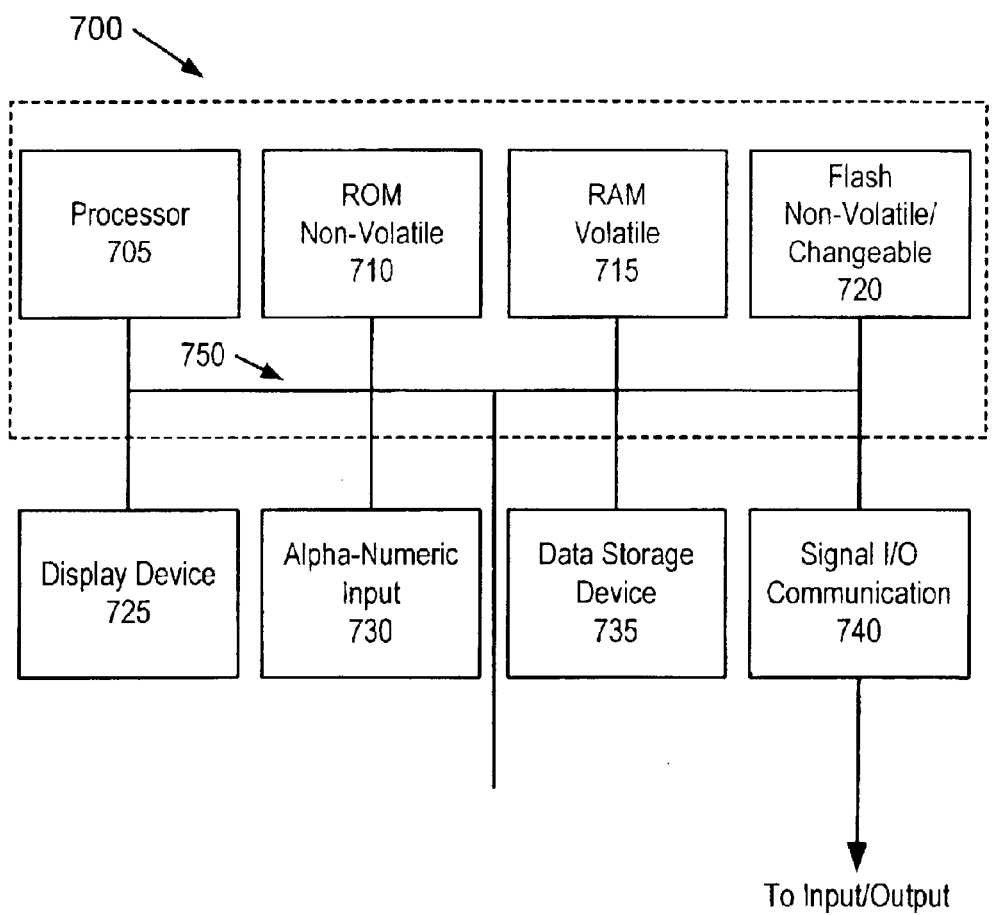
FIG. 7 illustrates circuitry of computer system, which may form a platform for the implementation of embodiments of the present invention.

FIG. 7 illustrates circuitry of computer system 700, which may form a platform for the implementation of embodiments of the present invention. Computer system 700 includes an address/data bus 750 for communicating information, a central processor 705 functionally coupled with the bus for processing information and instructions, a volatile memory 715 (e.g., random access memory RAM) coupled with the bus 750 for storing information and instructions for the central processor 705 and a non-volatile memory 710 (e.g., read only memory ROM) coupled with the bus 750 for storing static information and instructions for the processor 705. Computer system 700 also optionally includes a changeable, non-volatile memory 720 (e.g., flash) for storing information and instructions for the central processor 705, which can be updated after the manufacture of system 700.

Computer system 700 also optionally includes a data storage device 735 (e.g., a rotating magnetic disk) coupled with the bus 750 for storing information and instructions.

Also included in computer system 700 of FIG. 7 is an optional alphanumeric input device 730. Device 730 can communicate information and command selections to the central processor 700. Device 730 may take the form of a touch sensitive digitizer panel or typewriter-style keyboard. Display device 725 utilized with the computer system 700 may be a liquid crystal display (LCD) device, cathode ray tube (CRT), field emission device (FED, also called flat panel CRT), light emitting diode (LED), plasma display device, electro-luminescent display, electronic paper or other display device suitable for creating graphic images and alphanumeric characters recognizable to the user. Optional signal input/output communication device 740 is also coupled to bus 750.

Embodiments of the present invention precondition a placing of cells of an integrated circuit design. Further embodiments of the present invention estimate the curvature of an objective function used to optimize the placement of cells of an integrated circuit design. Still further embodiments of the present invention exploit a sequential nature of processing cells to solve a system of relations in a very efficient manner.

The preferred embodiment of the present invention, placing cells of an IC design using partition preconditioning, is thus described. While the present invention has been described in particular embodiments, it should be appreciated that the present invention should not be construed as limited by such embodiments, but rather construed according to the below claims.

What is claimed is:

1. A computer implemented method for placing of circuit elements of an integrated circuit design comprising:
   grouping cells of an integrated circuit design to model curvature of an objective function, said grouping producing a plurality of cell clusters;
   estimating curvature of said objective function for each of said cell clusters;
   describing interactions between said cell clusters as a relation;
   determining a set of preconditioning values which achieves a separation of variables of said relation;
   scaling the variables of the objective function with the set of preconditioning values such that changing each variable of the objective function affects the objective function by a comparable amount to the preconditioning value within the set of preconditioning values; and
   placing said circuit elements using said preconditioning values.

2. The method as described in claim 1 wherein said grouping comprises merging cells based upon a minimum cell area.

3. The method as described in claim 1 wherein said plurality of cell clusters is modeled in a data structure in computer memory as a tree structure.

4. The method as described in claim 3 wherein said tree structure is a binary tree.

5. The method as described in claim 1 wherein said relation is quadratic.

6. The method as described in claim 5 wherein said interactions between said cell clusters are modeled in a data structure in computer memory as springs.

7. The method as described in claim 5 wherein placing cell circuit elements involves a calculation of a wire length comprising a weighting factor.

8. The method as described in claim 1 wherein said relation is not quadratic.

9. The method as described in claim 1 further comprising transforming variables to a preconditioning domain.

10. A system comprising:
    a processor coupled to a bus;
    a memory coupled to said bus and wherein said memory contains instructions
    that when executed implement a method comprising preconditioning a placing of circuit elements of an integrated circuit design, grouping cells of an integrated circuit design to model curvature of an objective function, said grouping producing a plurality of cell clusters;
    estimating curvature of said objective function for each of said cell clusters;
    describing interactions between said cell clusters as a relation;
    determining a set of preconditioning values which achieves a separation of variables of said relation; and
    scaling the variables of the objective function with the set of preconditioning values such that changing each variable of the objective function affects the objective function by a comparable amount to a preconditioning value within the set of preconditioning values.

11. The system as described in claim 10 wherein said grouping comprises merging cells based upon a minimum cell area.

12. The system as described in claim 10 wherein said plurality of cell clusters is modeled as a tree structure.

13. The system as described in claim 12 wherein said tree structure is a binary tree.

14. The system as described in claim 10 wherein said relation is quadratic.

15. The system as described claim 14 wherein said interactions between said cell clusters are modeled as springs.

16. The system as described in claim 10 wherein placing cell circuit elements involves a calculation of a wire length comprising a weighting factor.

17. The system as described in claim 10 wherein said relation is not quadratic.

18. The system as described in claim 10 further comprising transforming variables to a preconditioning domain.

19. The system as described in claim 10 further comprising placing said cells using said preconditioning values.

20. A computer-readable medium having computer-readable program code embodied therein for causing a computer system to perform a method; said method comprising preconditioning a placing of circuit elements of an integrated circuit design
- grouping cells of an integrated circuit design to model curvature of an objective function, said grouping producing a plurality of cell clusters;
- estimating curvature of said objective function for each of said cell clusters;
- describing interactions between said cell clusters as a relation;
- determining a set of preconditioning values which achieves a separation of variables of said relation; and
- scaling the variables of the objective function with the set of preconditioning values such that changing each variable of the objective function affects the objective function by a comparable amount to the preconditioning value within the set of preconditioning values.

21. The computer-readable medium of claim 20 wherein said method further comprises placing said cells using said preconditioning values.

* * * * *